United States Patent
Park

(10) Patent No.: US 8,144,521 B2
(45) Date of Patent: Mar. 27, 2012

(54) METHOD OF OPERATING NONVOLATILE MEMORY DEVICE

(75) Inventor: Young Soo Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 272 days.

(21) Appl. No.: 12/647,269

(22) Filed: Dec. 24, 2009

(65) Prior Publication Data

US 2010/0195406 A1     Aug. 5, 2010

(30) Foreign Application Priority Data

Feb. 2, 2009    (KR) ........................ 10-2009-0008059

(51) Int. Cl.
    *G11C 16/16*        (2006.01)
(52) U.S. Cl. .......... 365/185.25; 365/185.17; 365/185.18
(58) Field of Classification Search ............ 365/185.25, 365/185.18, 185.23, 185.2, 185.03, 185.17
See application file for complete search history.

(56) References Cited

U.S. PATENT DOCUMENTS

| | | | | |
|---|---|---|---|---|
| 5,862,074 A * | 1/1999 | Park | ....................... | 365/185.03 |
| 7,468,914 B2 * | 12/2008 | Toda | ....................... | 365/185.2 |
| 7,952,929 B2 * | 5/2011 | Kim et al. | ................ | 365/185.17 |
| 8,031,530 B2 * | 10/2011 | Joo | ....................... | 365/185.25 |

FOREIGN PATENT DOCUMENTS

KR         100842758         7/2008

OTHER PUBLICATIONS

Notice of Preliminary Rejection issued from Korean Intellectual Property Office on Aug. 23, 2010.

* cited by examiner

*Primary Examiner* — Gene Auduong
(74) *Attorney, Agent, or Firm* — IP & T Group LLP

(57) ABSTRACT

A method of operating a nonvolatile memory device comprising cell strings each comprising memory cells coupled in series between a drain select transistor and a source select transistor, including precharging a sense node to thereby precharge a bit line coupled to the cell string for a program or data read operation; and simultaneously resetting a cell channel in a state in which the drain select transistor is turned off, the source select transistor is turned on, and the memory cells are turned on by applying a first voltage to a number of word lines coupled to the memory cells during a first time period, wherein the first time period is less than a bit line precharge time period.

11 Claims, 4 Drawing Sheets

METHOD OF OPERATING NONVOLATILE MEMORY DEVICE

CROSS-REFERENCE TO RELATED APPLICATION

Priority to Korean patent application number 10-2009-0008059 filed on Feb. 2, 2009, the entire disclosure of which is incorporated by reference herein, is claimed.

BACKGROUND

One or more embodiments relate to a method of operating a nonvolatile memory device and, more particularly, to a method of operating a nonvolatile memory device, in which a channel in the bit line precharge step of a nonvolatile memory device is reset.

A nonvolatile memory device includes a memory cell array, a row decoder, and a page buffer. The memory cell array includes a plurality of word lines extending in rows, a plurality of bit lines extending in columns, and a plurality of cell strings corresponding to the respective bit lines.

The row decoder, coupled to a string selection line, word lines, and a common source line, is placed on one side of the memory cell array. The page buffer coupled to a plurality of bit lines is placed on the other side of the memory cell array.

Recently, to further increase the degree of integration of flash memory cells, active research has .1begun on a multi-bit cell, which is able to store plural data In1 a single memory cell. This type of a memory cell is called a multi-level cell (MLC). A memory cell capable of storing a single bit is called a single level cell (SLC).

FIG. 1A is a diagram showing part of the structure of a memory cell array of a nonvolatile memory device.

Referring to FIG. 1A, the memory cell array 100 includes a number of memory cells and NMOS transistors.

A predetermined number of memory cells and two NMOS transistors are coupled together in series to form a cell string. In such a cell string, the two NMOS transistors are coupled on opposite ends of the memory cells, which are coupled together in series, and are referred to as a drain select transistor (hereinafter referred to as a 'DST') and a source select transistor (hereinafter referred to as a 'SST').

The gates of the memory cells of a number of the cell strings are coupled to respective word lines, and the gates of the DSTs of the cell strings are commonly coupled to a drain select line (hereinafter referred to as a 'DSL'). Furthermore, the gates of the SSTs of the cell strings are commonly coupled to a source selection line (hereinafter referred to as an 'SSL').

The drain terminal of the DST is coupled to a bit line, and the source terminal of the SST is coupled to a common source line CSL. Furthermore, one or more bit lines are coupled to a sense node (not shown) of the page buffer.

FIG. 1B is a timing diagram illustrating the data read operation of the nonvolatile memory device.

Referring to FIG. 1B, to read data, the nonvolatile memory device first precharges the sense node of a page buffer coupled to a bit line to which a selected memory cell is coupled.

Next, the bit line is precharged, and an evaluation operation is performed by applying a read voltage to a word line coupled to the selected memory cell and a read voltage (or a pass voltage) to the remaining word lines such that a voltage of the bit line is changed. The page buffer senses data stored in the selected memory cell in response to a changed bit line voltage and stores the sensed data.

The read voltage applied to the selected word line is called a sense voltage Vsensing, and the voltage applied to the remaining word lines is a read voltage Vread. The read voltage Vread has a voltage level which turns on the corresponding memory cells irrespective of their program states.

While precharging the bit line, an operation for resetting the channel of the cell string is performed. To this end, the SST is turned on by temporarily applying the read voltage Vread to the SSL, and current remaining in the channel is discharged.

If the threshold voltage of the selected memory cell is less than the sense voltage Vsensing while resetting the channel, all the memory cells of the cell string are turned on, and the current for precharging, applied to the bit line, is drained through the SST, thereby increasing current consumption. Further, there is concern that the time that it takes to precharge the bit line is lengthened because the precharging of the bit line is not started until the SST is turned off by applying 0 V to the SSL after the reset of the channel.

BRIEF SUMMARY

One or more embodiments relate to a method of operating a nonvolatile memory device which is capable of reducing current consumption in a channel reset operation performed together with a bit line precharge operation.

According to an aspect of this disclosure, a method of operating a nonvolatile memory device, comprising cell strings each comprising memory cells coupled in series between a drain select transistor and a source select transistor, includes, precharging a sense node to thereby precharge a bit line coupled to the cell string for a program or data read operation, and simultaneously resetting a cell channel in a state in which the drain select transistor is turned off, the source select transistor is turned on, and the memory cells are turned on by applying a first voltage to a number of word lines coupled to the memory cells during a first time period, wherein the first time period is less than a bit line precharge time period.

The first voltage has a voltage level high enough to turn on all the memory cells.

The method further includes applying, after the first time period, a program or read voltage to a memory cell selected for the program or read operation, respectively.

The cell channel is reset to 0 V.

According to another aspect of this disclosure, a method of operating a nonvolatile memory device, comprising cell strings each comprising memory cells coupled in series between a drain select transistor and a source select transistor, includes, precharging a sense node to thereby precharge a bit line coupled to the cell string for a program or data read operation, and simultaneously resetting a cell channel in a state in which the drain select transistor is turned on, the source select transistor is turned off, and the memory cells are turned on by applying a first voltage to a number of word lines coupled to the memory cells during a first time period, wherein the first time period is less than a bit line precharge time period.

The first voltage has a voltage level high enough to turn on all the memory cells.

The method further includes applying, after the first time period, a program or read voltage to a memory cell selected for the program or read operation, respectively.

The cell channel is reset to a voltage level precharged on the bit line.

According to yet another aspect of this disclosure, a method of operating a nonvolatile memory device, comprising cell strings each comprising memory cells coupled in series between a drain select transistor and a source select transistor, includes, precharging a sense node to thereby precharge a bit line coupled to the cell string for a program or data read operation, and simultaneously resetting a cell channel in a state in which one of the drain select transistor and the source select transistor is turned on, the other of the drain select transistor and the source select transistor is turned off, and the memory cells are turned on by applying a first voltage to a number of word lines coupled to the memory cells during a first time period, wherein the first time period is less than a bit line precharge time period.

In the case where the drain select transistor is turned off and the source select transistor is turned on, the cell channel is reset to 0 V.

In the case where the drain select transistor is turned on and the source select transistor is turned off, the cell channel is reset to a voltage level precharged on the bit line.

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1A:
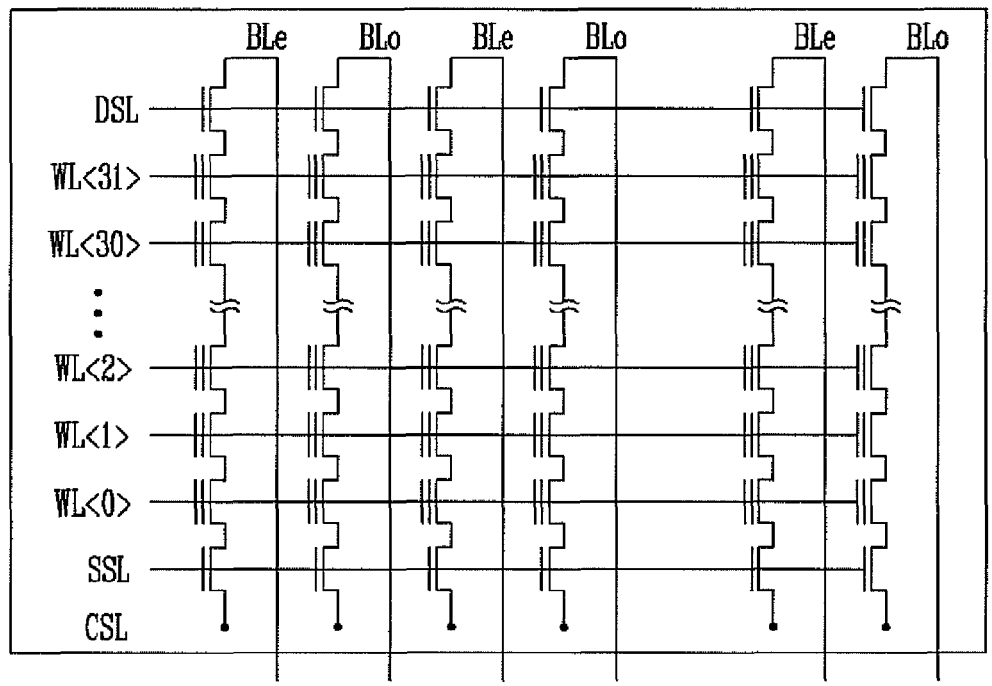
FIG. 1A is a diagram showing part of the structure of a memory cell array of a nonvolatile memory device.
Figure 1B:
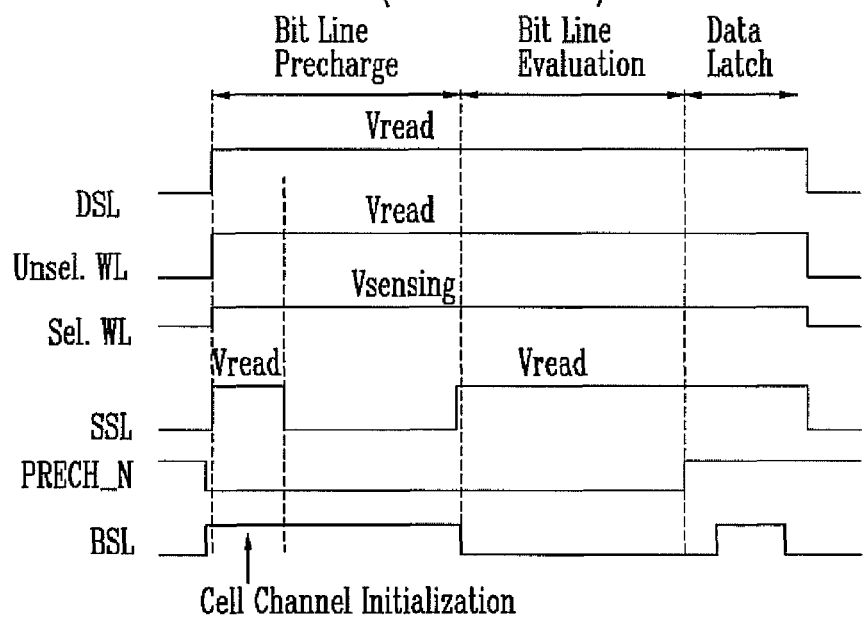
FIG. 1B is a timing diagram illustrating the data read operation of the nonvolatile memory device.
Figure 2A:
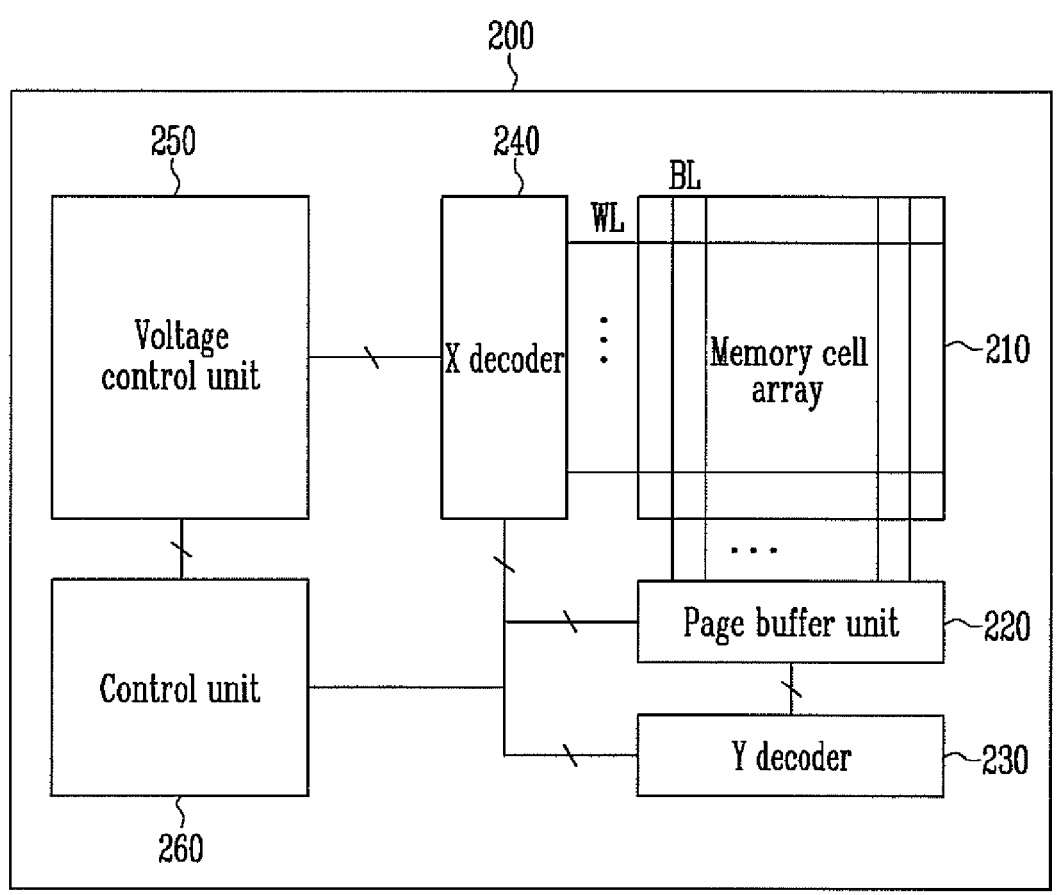
FIG. 2A is a block diagram of a nonvolatile memory device according to an embodiment of this disclosure.

FIG. 2A is a block diagram of a nonvolatile memory device according to an embodiment of this disclosure.

Referring to FIG. 2A, the nonvolatile memory device 200 includes a memory cell array 210, a page buffer unit 220, a Y decoder 230, an X decoder 240, a voltage control unit 250, and a control unit 260.

The memory cell array 210 includes memory cells for storing data. Each memory cell is coupled to a word line WL and a bit line BL. Furthermore, a group of the word lines constitutes a memory block.

The page buffer unit 220 includes page buffers PB each coupled to one or more bit lines BL and configured to latch data to be programmed into a memory cell coupled to a selected bit line or to store data read from a memory cell.

The Y decoder 230 is configured to provide a path for the input/output data of the page buffers PB. The X decoder 240 is configured to couple a global word line for providing operating voltages and the word lines of the memory cell array 210.

The voltage supply unit 250 is configured to generate the operating voltages supplied to the global word line. The control unit 260 is configured to control the operations of the page buffer unit 220, the Y decoder 230, the X decoder 240, and the voltage supply unit 250 such that data is programmed into a memory cell or data stored in a memory cell is read.

Figure 2B:
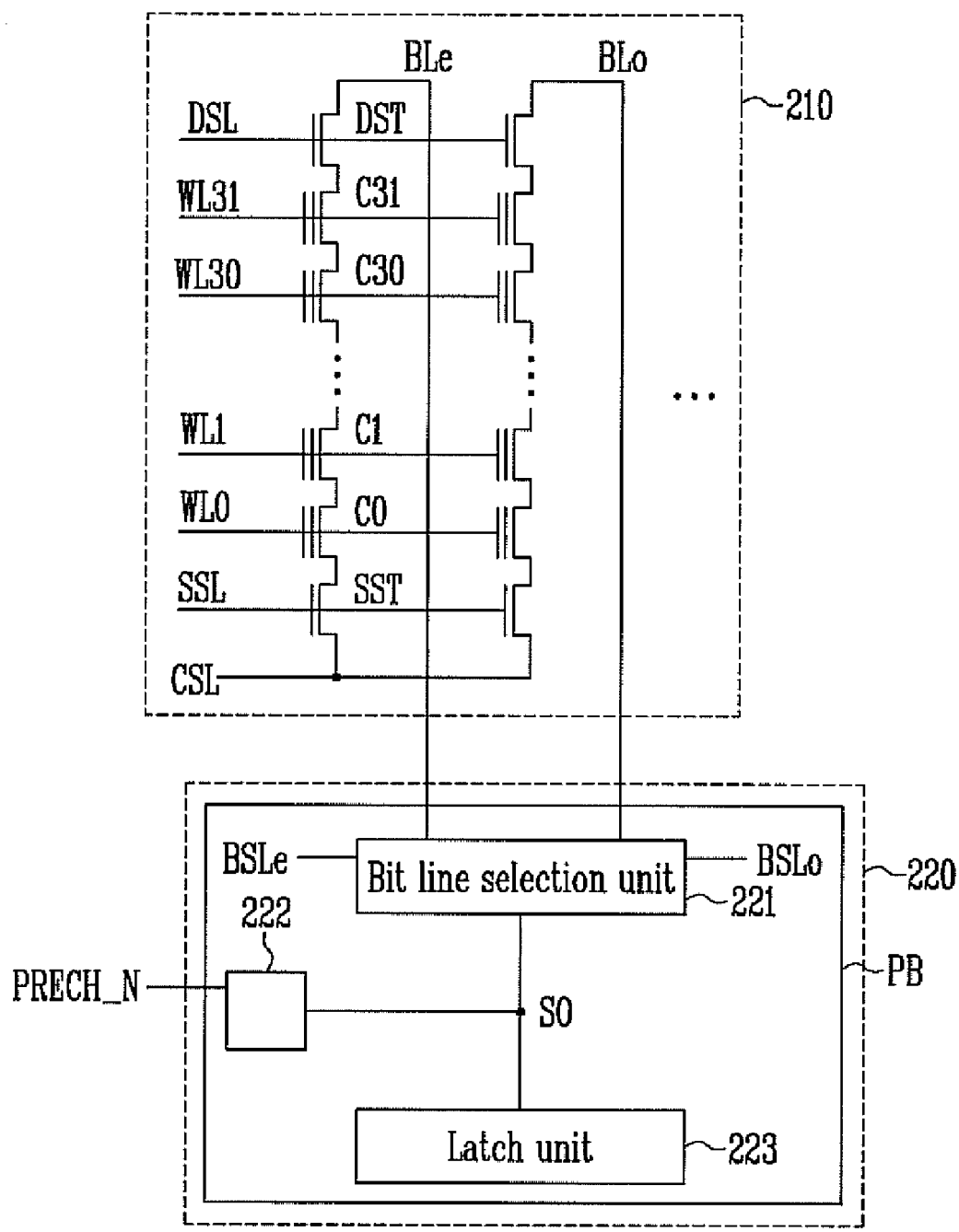
FIG. 2B is a simplified diagram of the memory cell array and the page buffer unit shown in FIG. 2A.

FIG. 2B is a simplified diagram of the memory cell array 210 and the page buffer unit 220 shown in FIG. 2A.

Referring to FIG. 2B, the memory cell array 210 includes a number of cell strings. Each of the cell strings includes $0^{th}$ to thirty-first memory cells C0 to C31, a DST, and an SST.

Furthermore, each cell string is coupled to a bit line. A pair of bit lines, including an even bit line BLe and an odd bit line BLo, are coupled to the page buffer PB. The page buffer PB includes a bit line selection unit 221, a precharge unit 222, and a latch unit 223.

The $0^{th}$ to thirty-first memory cells C0 to C31 of each cell string are coupled together in series. The DST is coupled to the drain terminal of the last one of the memory cells coupled together in series, and the SST is coupled to the source terminal of the first one of the memory cells coupled together in series. The bit line is coupled to the drain terminal of the DST, and a common source line CSL is coupled to the source terminal of the SST.

The gate terminals of the SSTs of all the cell strings are coupled to a source select line SSL, and the gate terminals of the DSTs of all the cell strings are coupled to a drain select line DSL.

Furthermore, a $0^{th}$ word line WL0 is coupled to the gate terminal of the $0^{th}$ memory cell C0. Moreover, the $0^{th}$ to thirty-first word lines WL0 to WL31 are respectively coupled to the $0^{th}$ to thirty-first memory cells C0 to C31. The channels of the $0^{th}$ to thirty-first memory cells C0 to C31 of the cell string are interconnected to form a cell channel.

The bit line selection unit 221 of the page buffer PB is coupled to the even bit line BLe and the odd bit line BLo. The bit line selection unit 221 is configured to select the even bit line BLe or the odd bit line BLo in response to an input address and to couple a selected bit line to the sense node SO. An even bit line selection signal BSLe for selecting the even bit line BLe and an odd bit line selection signal BSLo for selecting the odd bit line BLo are inputted to the bit line selection unit 221.

The precharge unit 222 is configured to precharge the sense node SO in response to a control signal. A precharge control signal PRECH_N for precharging the sense node SO is inputted to the precharge unit 222. For example, when the precharge control signal PRECH_N of a low level is received, the precharge unit 222 precharges the sense node SO. Further, the latch unit 223 includes latch circuits for latching data in response to a state of the sense node SO.

Resetting the cell channel during the bit line precharge operation in the nonvolatile memory device 200 according to an embodiment of this disclosure is performed as follows.

Figure 3:
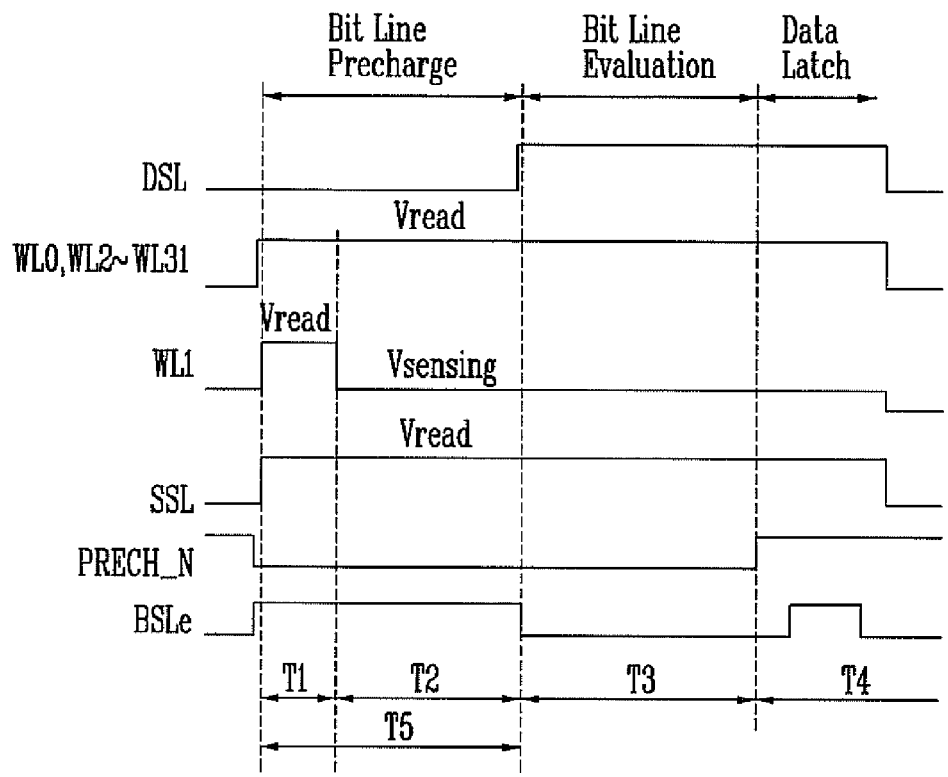
FIG. 3 is a timing diagram illustrating a method of operating the nonvolatile memory device according to a first embodiment of this disclosure.

FIG. 3 is a timing diagram illustrating a method of operating the nonvolatile memory device according to a first embodiment of this disclosure.

More specifically, FIG. 3 illustrates the timing diagram of control signals when a data read operation is performed. The data read operation of FIG. 3 is described below with reference to FIGS. 2A and 2B.

For the data read operation, the control unit 260 selects a word line and a bit line in response to an external address received along with an external read command, and precharges a selected bit line. In the first embodiment of the present disclosure, it is assumed that the even bit line BLe and the first word line WL1 are selected.

The selected bit line is precharged. To this end, the precharge control signal PRECH_N of a low voltage level is applied to thereby precharge the sense node SO with a power source voltage level.

Further, the even bit line selection signal BSLe of a high voltage level is applied to the bit line selection unit 221 to thereby couple the even bit line BLe and the sense node SO together. The even bit line BLe is coupled to the sense node SO, and is precharged with a voltage of the precharged sense node SO. Here, 0 V is applied to the DSL, and the read voltage Vread is applied to the SSL. Accordingly, the DST is turned off and the SST is turned on. Furthermore, the read voltage Vread has a voltage level high enough to turn on the DST, the SST, or the memory cells.

Furthermore, to reset the cell channel, during a first time T1, the read voltage Vread is applied to the $0^{th}$ to thirty-first word lines WL0 to WL31. The $0^{th}$ to thirty-first memory cells C0 to C31 are turned on in response to the read voltage Vread, and so the cell channel is reset to 0 V.

Here, since the DST maintains the turn-off state, current precharged in the even bit line BLe is not transferred to the cell channel. Accordingly, the precharge current in the even bit line BLe can be precharged without being lost.

After the first time T1, the sense voltage Vsensing is applied to the first word line WL1, thereby preparing to read data.

After a lapse of a second time T2 subsequent to the first time T1, the read voltage Vread is applied to the DSL, and the SSL maintains the read voltage Vread. In this state, during a third time T3, an evaluation operation for changing a voltage of the even bit line BLe according to a program state of the first memory cell C1 coupled to the first word line WL1 is performed.

After the evaluation process is completed, the even bit line BLe is coupled to the sense node SO, such that a voltage of the sense node SO is changed. Next, the latch unit 223 latches data according to a voltage state of the sense node SO. Data latched in the latch unit 223 is data stored in the first memory cell C1.

The evaluation operation and the latch operation are similar to the read operation and latch operation of a known nonvolatile memory device, and a further description thereof is omitted for simplicity.

According to the first embodiment of this disclosure, the cell channel is reset during the bit line precharge operation. Here, the DST is turned off so that the reset of the cell channel does not have an effect on the precharge of the bit line, thereby being capable of preventing the loss of current for precharging the bit line.

Meanwhile, the cell channel may be reset according to a second embodiment of the present disclosure.

Figure 4:
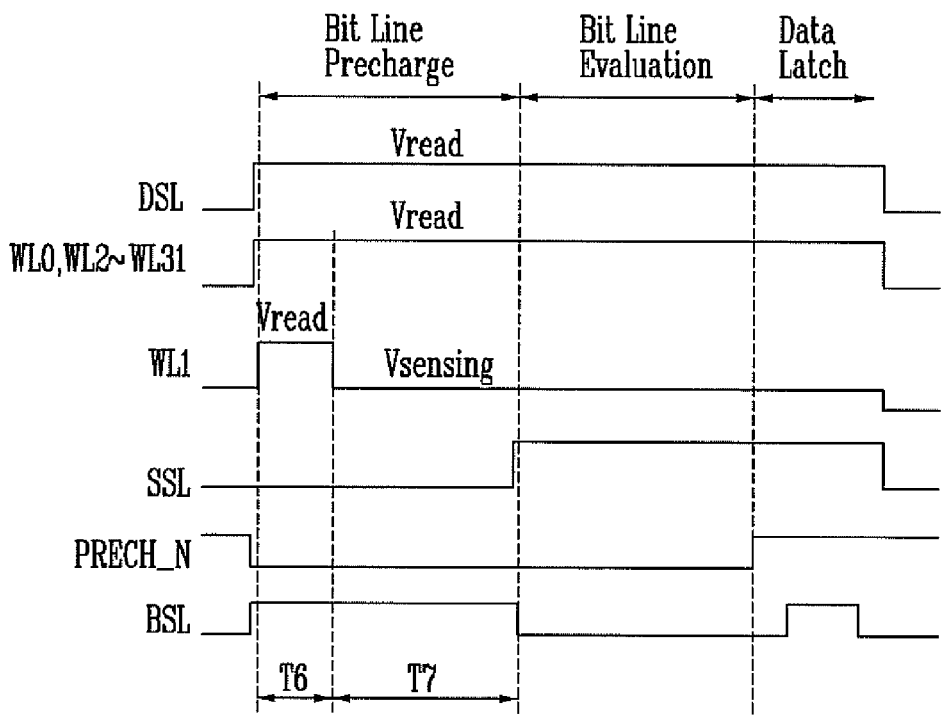
FIG. 4 is a timing diagram illustrating a method of operating the nonvolatile memory device according to a second embodiment of this disclosure.

FIG. 4 is a timing diagram illustrating a method of operating the nonvolatile memory device according to a second embodiment of this disclosure.

More specifically, FIG. 4 illustrates the timing diagram of control signals when a data read operation is performed. The data read operation of FIG. 4 is described below with reference to FIGS. 2A and 2B.

Even in the second embodiment of the present disclosure, for the data read operation, the control unit 260 selects a word line and a bit line in response to an external address received along with an external read command, and precharges a selected bit line. In the second embodiment of the present disclosure, it is assumed that the even bit line BLe and the first word line WL1 are selected.

The selected bit line is precharged. To this end, the precharge control signal PRECH_N of a low voltage level is applied to thereby precharge the sense node SO with a power source voltage level.

Further, the even bit line selection signal BSLe of a high voltage level is applied to the bit line selection unit 221 to thereby couple the even bit line BLe and the sense node SO together. The even bit line BLe is coupled to the sense node SO, and is precharged with a voltage of the precharged sense node SO. Here, the read voltage Vread is applied to the DSL, and 0 V is applied to the SSL. Accordingly, the DST is turned on and the SST is turned off.

Furthermore, to reset the cell channel, during a sixth time T6, the read voltage Vread is applied to the $0^{th}$ to thirty-first word lines WL0 to WL31. The $0^{th}$ to thirty-first memory cells C0 to C31 are turned on in response to the read voltage Vread, and so the cell channel is reset to a voltage level of the precharged bit line.

Here, since the SST maintains the turn-off state, current precharged in the even bit line BLe is not drained to the common source line CSL. Accordingly, the precharge current for the even bit line BLe can be precharged by the even bit line BLe without being lost.

Although the first and second embodiments of the present disclosure have been described in relation to precharging a bit line when data is read, they can be applied to precharge a bit line in all operations for resetting a cell channel.

According to the first and second embodiments, while a bit line is precharged, current drained to the common source line through a cell channel is prevented. Accordingly, the loss of current can be reduced. Furthermore, since the loss of current is reduced, a concern about the time that it takes to precharge a bit line is lengthened because of current drained to the common source line can be addressed.

As described above, according to the method of operating the nonvolatile memory device, current for precharging a bit line can be prevented from being drained, when a cell channel is reset while the bit line is precharged. Accordingly, current consumption and the time that it takes to precharge a bit line can be reduced.

What is claimed is:

1. A method of operating a nonvolatile memory device comprising cell strings each comprising memory cells coupled in series between a drain select transistor and a source select transistor, the method comprising:
    precharging a sense node to thereby precharge a bit line coupled to the cell string for a program or data read operation; and
    simultaneously resetting a cell channel in a state in which the drain select transistor is turned off, the source select transistor is turned on, and the memory cells are turned on by applying a first voltage to a number of word lines coupled to the memory cells during a first time period,
    wherein the first time period is less than a bit line precharge time period.

2. The method of claim 1, wherein the first voltage has a voltage level high enough to turn on all the memory cells.

3. The method of claim 1, further comprising, applying, after the first time period, a program or read voltage to a memory cell selected for the program or read operation, respectively.

4. The method of claim 1, wherein the cell channel is reset to 0 V.

5. A method of operating a nonvolatile memory device comprising cell strings each comprising memory cells coupled in series between a drain select transistor and a source select transistor, the method comprising:
    precharging a sense node to thereby precharge a bit line coupled to the cell string for a program or data read operation; and
    simultaneously resetting a cell channel in a state in which the drain select transistor is turned on, the source select transistor is turned off, and the memory cells are turned on by applying a first voltage to a number of word lines coupled to the memory cells during a first time period, wherein the first time period is less than a bit line precharge time period.

6. The method of claim 5, wherein the first voltage has a voltage level high enough to turn on all the memory cells.

7. The method of claim 5, further comprising, applying, after the first time period, a program or read voltage is applied to a memory cell selected for the program or read operation, respectively.

8. The method of claim 5, wherein the cell channel is reset to a voltage level precharged on the bit line.

9. A method of operating a nonvolatile memory device comprising cell strings each comprising memory cells coupled in series between a drain select transistor and a source select transistor, the method comprising:
   precharging a sense node to thereby precharge a bit line coupled to the cell string for a program or data read operation; and
   simultaneously resetting a cell channel in a state in which one of the drain select transistor and the source select transistor is turned on, the other of the drain select transistor and the source select transistor is turned off, and the memory cells are turned on by applying a first voltage to a number of word lines coupled to the memory cells during a first time period,
   Wherein the first time period is less than a bit line precharge time period.

10. The method of claim 9, wherein the cell channel is reset to 0 V, where the drain select transistor is turned off and the source select transistor is turned on.

11. The method of claim 9, wherein the cell channel is reset to a voltage level precharged on the bit line, where the drain select transistor is turned on and the source select transistor is turned off.

* * * * *